United States Patent [19]

Work

[11] 3,708,669

[45] Jan. 2, 1973

[54] METHOD AND APPARATUS FOR CALIBRATING A SOLAR ARRAY

[75] Inventor: George A. Work, Malibu, Calif.

[73] Assignee: TRW Inc., Redondo Beach, Calif.

[22] Filed: May 4, 1970

[21] Appl. No.: 34,362

[52] U.S. Cl.............250/205, 250/217 R, 315/241 P, 315/241 S

[51] Int. Cl...............................................G01j 1/32

[58] Field of Search........250/205, 217 R; 315/241 P, 315/241 S

[56] References Cited

UNITED STATES PATENTS 3,033,988 5/1962 Edgerton..............................250/205

3,360,650 12/1967 Lawrence.........................250/205 X 3,546,529 12/1970 Griffin..............................315/241 P

*Primary Examiner*—Archie R. Borchelt

*Attorney*—Daniel T. Anderson, Donald R. Nyhagen and Jerry A. Dinardo

[57] ABSTRACT

A method and apparatus for calibrating a solar array to predict its characteristic volt-ampere or I-V curve in outer space by periodically illuminating the array in rapid succession with a flashlamp whose radiation closely simulates natural solar radiation in outer space, and measuring the array current at short circuit, open circuit, and selected array voltage levels. The output of a standard cell which is illuminated concurrently with the solar array by each flash is recorded to permit correction for any variation from flash-to-flash.

12 Claims, 2 Drawing Figures

INVENTOR.
George A. Work
BY
ATTORNEY

METHOD AND APPARATUS FOR CALIBRATING A SOLAR ARRAY

BACKGROUND OF THE INVENTION

1. Field of the invention

This invention relates generally to solar arrays and more particularly to a method of and apparatus for predicting the characteristic I-V curve of a solar array in outer space.

2. Prior Art

One essential step in the manufacture of a solar array involves its calibration to determine or predict its I-V characteristic curve in outer space. This calibration involves illumination of the array with radiation simulating natural solar radiation in outer space, and measurement of the array current at open circuit, short circuit, and selected array voltage levels. At the present time, calibration of a solar array is generally performed with natural sunlight at a location, such as a mountain or desert location, where the level of scattered light is relatively low. This calibration method has the inherent disadvantage that large corrections are necessary, even under ideal conditions, to extrapolate the calibration data to a reasonably accurate assessment of the performance of the array in outer space. Such corrections are necessary to compensate for the substantial differences in the intensity and spectral content of natural solar radiation and the difference between the operating temperature of a solar array in outer space and at the surface of the earth. Thus, solar radiation at the earth's surface generates less than 70 percent of the solar array power generated in outer space. Also, a solar array exposed to daylight at the earth's surface operates at a much higher temperature than does the same array in outer space.

Various alternative solar array calibration techniques, involving the use of artificial illumination simulating natural solar radiation in outer space, have been devised to avoid the above problems. According to one of these calibration techniques, the solar array is illuminated continuously during the calibration procedure. This calibration procedure is unsatisfactory, however, for the reason that such continuous illumination causes excessive heating of the array. According to another calibration technique, the above heating problem is solved by illuminating the solar array intermittently in a manner such that no appreciable radiant heating of the array occurs and measuring, during the successive flashes, the array current at different selected operating conditions, such as open circuit, shOrt circuit, and selected array voltage levels.

SUMMARY OF THE INVENTION

The present invention provides an improved solar array calibration method and apparatus which utilizes the latter intermittent array illumination technique. According to one feature of the invention, the radiation source used for calibration is a flashlamp which is maintained at substantially a constant intensity level for a fixed period of time during each flash, and the array calibration readings are taken during these periods of constant intensity. In the disclosed embodiment of the invention, the illumination source is a xenon flashlamp which is energized at a high density current level during each flash, such that the light of each flash closely simulates natural solar radiation in outer space. According to another feature of the invention, the intensity level of the radiation incident on the solar array during each flash is monitored by a standard cell to permit correction of the calibration data for any variation in the incident light intensity from flash-to-flash.

In the course of the present calibration procedure, the operating conditions of the solar array are varied from flash-to-flash to provide a number of different calibration points from which may be charted the characteristic I-V curve of the array. A typical calibration run, according to the invention, for example, involves measurement of the array output current at open circuit, short circuit, and selected array voltage levels. The calibration apparatus is stepped or switched automatically through these selected operating conditions in response to successive flashes of the flashlamp.

DESCRIPTION OF THE PREFERRED EMBODIMENTS

Figures 1, 2:
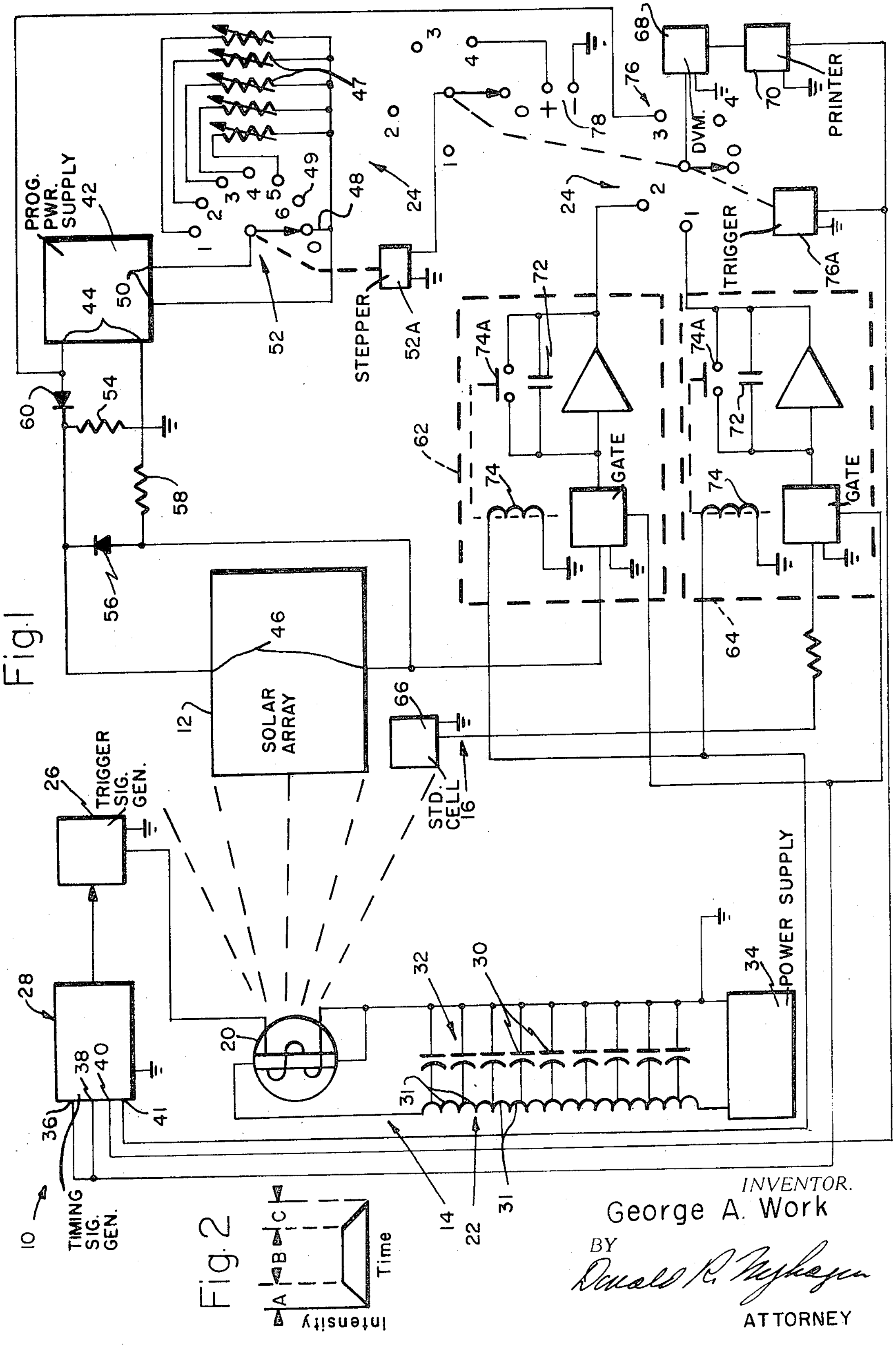
FIG. 1 is a schematic circuit diagram of a solar array calibration apparatus according to the invention.
FIG. 2 is a diagram illustrating the variation in array illumination intensity with time.

The drawings illustrate a calibration apparatus 10 according to the invention for calibrating a solar array 12 to predict its characteristic I-V curve. In general terms, the calibration apparatus comprises means 14 for periodically illuminating the solar array 12 with artificial light closely simulating natural solar radiation in outer space, means 16 for sensing the intensity of the light incident on the solar array during each illumination, and means 18 for monitoring the output of the sensing means and the output of the solar array at different selected operating conditions during the successive exposures of the array to the light of the illumination means. In the disclosed practice of the invention, the solar array is calibrated at open circuit, short circuit, and selected array voltage levels.

According to one feature of the invention, the array illumination means 14 comprises a xenon flashlamp 20 which is flashed with an extremely high density current, such that the light emitted by the lamp during each flash closely simulates, in both intensity and spectral content, natural solar radiation in outer space. According to another feature of the invention, the energizing circuit 22 for the flashlamp 20 is arranged to maintain each lamp flash at a predetermined peak intensity for a determined period of time by means of capacitors and inductors connected so as to form a discharge delay line, and the output monitoring means 18 are arranged to read the output of the solar array 12 and the light intensity sensing means 18 during these peak intensity periods. The readings obtained from the sensing means 16 permits correction of the array calibration data to compensate for any variations in the light intensity incident on the solar array during successive flashes of the flashlamp 20. Monitoring means 18 includes switching means 24 for automatically stepping or sequencing the solar array 12 to the above mentioned preset operating conditions in response to successive flashes of the lamp 20.

Referring now in greater detail to the particular embodiment of the invention selected for illustration, the flashlamp 20 flashes periodically in response to a periodic trigger signal from a trigger signal generator 26 actuated by a timing signal generator 28. The electrical flashing current for the lamp 20 is furnished by a bank of capacitors 30 and inductors 31 forming a discharge delay line 32 connected in parallel across an electrical power supply 34. As noted earlier, a feature of the invention resides in the fact that the xenon flashlamp 20 is conditioned to emit light closely simulating natural solar radiation in outer space by flashing the lamp within an extremely high current density. This current density is on the order of 1,000 amp per square centimeter of cross-sectional area of the flashlamp gas column. The discharge delay line 32 and power supply 34 are arranged to provide this current density.

Timing signal generator 28 may comprise any timing signal generator capable of periodically generating a group of successive timing pulses in the timed sequence discussed below. The first timing pulse of each periodic pulse group produced by the timing signal generator 28 is a flash initiating pulse which is applied to the flashlamp trigger signal generator 26. This flash initiating pulse actuates the trigger signal generator to produce a trigger pulse of the proper magnitude to initiate one flash of the lamp 20 by the high density current resulting from discharge of the capacitors and inductors in the discharge delay line 32. Any suitable trigger signal generator may be employed.

The initial flash initiating pulse of each periodic pulse group from the timing signal generator 28 is followed in rapid succession by a number of successive additional pulses whose purpose will be explained presently. Suffice it to say at this point that these additional pulses include, in the order and at the timing generator terminals listed, a gate-on pulse at a gate-on terminal 36, a gate-off pulse at a gate-off terminal 38, a series of print pulses at a print terminal 40, and a reset pulse at a reset terminal 41.

The several additional pulses, listed above, of each pulse group from the timing signal generator 28 occur at preset time intervals following the initial lamp flash initiating pulse of the respective group. In this regard, attention is directed to FIG. 2 which illustrates the time variation of intensity of each flash from the flashlamp 20. It will be observed that each flash has an initial phase A during which the flash intensity increases to a peak intensity level, an intermediate phase B during which the flash intensity remains generally constant at the peak level, and a final phase C during which the flash intensity drops. According to the present invention, the gate-on and gate-off signals from the timing signal generator 28 are timed to occur at the start and conclusion of the constant peak intensity phase of each flash. With a xenon flashlamp and discharge delay line operating at the current density specified earlier, the initial increasing intensity phase A of each flash is approximately 0.5 millisecond in duration so that the gate-on pulse of each periodic pulse group from the timing signal generator occurs approximately 0.5 millisecond following the first flash initiating pulse of the group. Peak intensity phase B of the flash is approximately 1 millisecond in duration. Accordingly, the gate-off pulse is timed to occur approximately 1.5 millisecond after the initial pulse. The following series of print pulses of each pulse group are timed to occur on the order of 1 second after the initial pulse. The final reset pulse of the timing signal generator occurs after the last print pulse.

The monitoring means 18 of the solar array calibrating apparatus comprises a programmable power supply 42 whose output terminals 44 are connected to the output terminals 46 of the solar array 12. Power supply 42 has a number of external programming potentiometers 47, a short circuit path 48, and an open circuit terminal 48 connected to the programming terminals 50 of the power supply 42 through a stepping sequencer 52. This stepping sequencer will be referred to again presently. Suffice it to say at this point that the sequencer operates to connect the potentiometers 47, short circuit path 48, and the open circuit terminal 49 to the power supply programming terminals 50 in the sequencer described below. Connection of any one of the programming potentiometers 47 to the power supply 42 conditions the latter to clamp the solar array 12 at a predetermined voltage level determined by the setting of the respective potentiometer. When the short circuit path 48 is connected to the power supply 42, the latter presents a short circuit across the solar array so that the latter operates at its short circuit voltage level. Finally, when the open circuit terminal 49 is connected to the power, the presents an open circuit across the solar array, and the array operates at its open circuit voltage level. A large bleeder resistor 54 is connected across the power supply terminals so that the solar array current never exceeds the power supply output. A protective diode 56, small load resistor 59, and a diode 60 are also provided, as shown.

Monitoring means 18 also comprises a pair of gated integrators 62, 64, a standard cell 66 embodied in the light intensity sensing means 16, and a digital voltmeter 68 coupled with printer 70 for printing out the voltmeter readings. The input of the gated integrator 62 is connected to the solar array 12 to integrate the photovoltaic current in the array. The input of the gated integrator 64 is connected to the standard cell 66 to integrate the photovoltaic current in the cell. These integrators serve to smooth out variations in the solar array and standard cell currents resulting from flash intensity variations during the one millisecond sampling time representing phase B of each flash. To this end, the gating terminals of the integrators are connected to the gate-on and gate-off terminals 36, 38 of the timing signal generator 28. Each gate-on signal from the generator triggers the integrators on to monitor the solar array and standard cell currents. Each gate-off signal triggers the integrators off to store information representing the integrated solar array and standard cell currents.

Each gated integrator 62, 64 has an integrating capacitor 72 shunted by the normally open contact **74*a* of a reset relay 74. Reset relays 74 are connected to the reset terminal 41 of the timing signal generator 28. Each reset pulse from the generator momentarily energizes the reset relays to close their contact 74*a* thereby discharging the integrating capacitors 72 and resetting the integrators 64, 64** to their initial state.

The outputs of the gated integrators 62, 64 and the clamped voltage output of the power supply 42 are connected to the digital voltmeter 68 through a second stepping sequencer 76. The stepper 76a of sequencer 76 is connected to the print terminal 40 of the timing signal generator 28 for actuation by the print pulses from the generator. The print terminal of the generator is also connected to the printer 70. Each series of print pulses within each periodic pulse group produced by the timing signal generator 28 steps the sequencer 76 through its several positions back to its illustrated initial or normal position. The successive stepping positions of the sequencer are designated by the numerals 0 through 4. In position 1, the sequencer connects the output of gated integrator 64 to the digital voltmeter 68. In position 2, the sequencer connects the output of the gated integrator 62 to the voltmeter. In position 3, the sequencer connects the clamped output voltage terminal of power supply 42 to the voltmeter. In position 4, the sequencer connects a stepping voltage source 78 to the stepper 52*a* of sequencer 52 for stepping the latter sequence from one position to the next. The print pulses from the timing signal generator 28 are also delivered to the printer 70 and actuate the latter to record the readings of the digital voltmeter 68 in the manner explained below.

Returning to sequencer 52, the latter has a number of stepping positions 0 through 6. In the normal or initial position 0 of the sequencer, the latter connects the short circuit path 48 across the programming terminals 50 of the programmable power supply 42. Stepping of the sequencer from this normal position through its positions 1 through 5 connects the programming potentiometers 47 and the open circuit terminal 49 to the power supply 42 in succession.

In operation of the solar array calibration apparatus, the timing signal generator 28 operates to generate a number of timing pulse groups equal to the number, i.e. 7, of stepping positions of the programming sequencer 52. Assuming that this sequencer and the readout sequencer 76 are in their initial O positions, the first pulse of the first pulse group flashes the xenon flashlamp 20. The next pulse of the first pulse triggers on the gated integrators 62, 64 a preset time (0.5 millisecond) after initiation of the flash to enable the flash intensity to reach its peak intensity phase B. At the conclusion of this peak intensity phase (1.5 milliseconds), the timing signal generator 28 produces a gate-off signal which triggers off the gated integrators 62, 64. While in their on state, the integrators store voltage information representing the integrated short circuit of the solar array 12 and the current of the standard cell 66 produced by the first flash of lamp 20. In this regard, it is significant to note that in the current initial positions 0 of the programming sequencer 52, the latter connects the short circuit path 48 to the programmable power supply 42. As noted earlier, the power supply then provides a short circuit across the solar array 12 whereby the integrator 62 stores information representing the short circuit current of the array.

The series of print pulses produced by the timing signal generator 28 following the gate-off signal to the gated integrators 62, 64 step the readout sequencer 76 from its initial 0 position, through its several positions 1 through 4, back to its initial position and simultaneously actuates the printer 70 to record the reading of the digital voltmeter 68 in each position of the sequencer. Stepping of the sequencer through its positions 1, 2, and 3 connects the digital voltmeter 68, in sequence, to the integrator 64, integrator 62, and the clamped voltage outlet of the power supply 42. Accordingly, the voltmeter reads out, first, the stored information in the integrator 64, representing the current produced in the standard cell 66 during the previous flash of the lamp 20, next the stored information in the integrator 62 representing the short circuit current of the solar array 12, and finally, the short circuit voltage of the array. The printer 70 records these several voltmeter readings. Stepping of the sequencer 76 through its final position 4 back to its initial 0 position connects the stepping voltage source 78 to the stepper 52*a* of programming sequencer 52 to step the latter sequencer to its stepping position 1. In this stepping position of the sequencer 52, the first programming potentiometer 47 is connected across the programming terminals 50 of the power supply 42 to cause the latter to clamp the solar array 12 at the preset voltage level determined by the setting of the potentiometer. Following return of the readout sequencer 76 to its initial 0 position by the last print pulse from the timing signal generator 28, the latter produces a final reset pulse which is applied to the gated integrator reset relays 74 to restore the integrators 62, 64 to their initial condition and thus complete the first operating cycle of the apparatus.

The timing signal generator 28 then produces a second group of timing pulses to repeat the above cycle with the solar array 12 clamped at its new voltage level. The same operating cycle is thereafter repeated for each of the preset solar array voltage levels determined by the several programming potentiometers 48 and the final open circuit 49, the programming sequencer 52 being stepped from one position to the next by the readout sequencer 76 at the conclusion of each cycle. The several solar array voltage and current readings thus obtained with the apparatus establish the characteristic I-V curve for the array. The readings of the standard cell 66 permit correction of the calibration data obtained to compensate for any variation in light intensity from one flash to the next.

It will be understood that the timing signal generator 28 triggers the flashlamp 20 at the proper intervals to permit full recharging of the capacitor bank 30 following each flash. If desired, a circuit (not shown) may be provided for sensing the voltage level in the capacitor bank and inhibiting the timing signal generator against flashing the lamp until the capacitor bank is fully charged.

What is claimed as new in support of letters patent is:

1. In the method of calibrating a solar array to predict its characteristic I-V curve, the steps comprising:

selecting a flashlamp which emits light simulating natural solar radiation in outer space;

selecting a standard photocell responsive to said light;

periodically illuminating said array for the same interval of time and with approximately the same light intensity by flashing said lamp a number of times in rapid succession; and sensing with said standard cell and recording the intensity of light incident on said array during each flash.

2. The method of claim 1 including the additional step of:

maintaining the intensity of each flash substantially constant at the same preset peak level for the same interval of time during each successive flash.

3. The method of claim 2 wherein:

said flashlamp is a xenon flashlamp energized with a high density current.

4. The method of calibrating a solar array to predict its characteristic I-V curve comprising the steps of:

selecting a flashlamp which emits light simulating natural solar radiation in outer space;

periodically illuminating said array for the same interval of time and with approximately the same light intensity by flashing said lamp a number of times in rapid succession;

during the successive flashes, monitoring the array output at preselected array operating conditions, such as open circuit, short circuit, and selected array voltage levels; and sensing and recording the intensity of light incident on said array during each flash to permit correction of the calibration data for any variations in the incident light intensity during successive flashes.

5. The method of claim 4 wherein:

said flashlamp is a xenon flashlamp energized with a high density current.

6. The method of claim 5 including the additional steps of:

maintaining the flash intensity aPproximately constant at the same peak value for the same time interval during each flash; and monitoring said array output only during the constant peak intensity portion of each flash.

7. Apparatus for calibrating a solar array to predict its characteristic I-V curve, comprising:

a flashlamp which emits light simulating natural solar radiation in outer space;

means for periodically illuminating said solar array by flashing said lamp a number of times in rapid succession; and means for maintaining the intensity of each flash substantially constant at the same peak value for the same interval of time during each flash.

8. Apparatus according to claim 7 wherein:

said flashlamp is a xenon flashlamp energized with a high density current.

9. Apparatus according to claim 8 including:

a standard cell for sensing the intensity of light incident on said solar array during each flash; and means for recording the cell output during each flash.

10. Apparatus for calibrating a solar array to predict its characteristic I-V curve, comprising:

a flashlamp which emits light simulating natural solar radiation in outer space;

means for periodically illuminating said array for the same interval of time and with approximately the same light intensity by flashing said lamp a number of times in rapid succession for the same time interval and at approximately the same intensity during each flash;

a standard cell for sensing the intensity of light incident on said array during each flash; and means for monitoring the output current of said standard cell and monitoring the output current of said array at selected operating conditions, such as open circuit, short circuit, and selected array voltage levels during the successive flashes.

11. Apparatus according to claim 10 wherein:

said means for flashing said lamp includes means for maintaining the intensity of each flash substantially constant at the same peak level for the same interval of time; and means for actuating said monitoring means to monitor said standard cell current and array current only during said peak intensity portion of each flash.

12. Apparatus for calibrating a solar array to predict its characteristic I-V curve, comprising:

a flashlamp which emits light simulating natural solar radiation in outer space;

means for illuminating said solar array by flashing said lamp a number of times in succession including a trigger signal generator for delivering a trigger pulse to said flashlamp in response to each flash initiating pulse to said generator, and a power supply for flashing said lamp in response to said trigger pulse in a manner such as to maintain the intensity of each flash substantially constant at a peak level for a preset period of time;

a standard cell for sensing the intensity of light incident on said array;

a pair of gated integrators connected to said standard cell and to said array for storing information representing the current produced in said standard cell and the current produced in said array during each flash;

a programmable power supply connected across said array for clamping said array at different preselected operating conditions including open circuit, short circuit, and selected array voltage levels, said power supply programming programminG means including a programming sequencer for stepping said latter power supply through its preselected operating conditions;

readout means including a readout sequencer for recording in succession the outputs of said integrators and the array voltage;

a timing signal generator connected to said trigger signal generator and said readout sequencer for generating periodic groups of timing pulses, each pulse group including an initial flash initiating pulse for actuating said trigger signal generator, a following gate-on pulse which occurs at the start of said peak intensity portion of the corresponding flash for triggering on said gated integrators to condition the latter for storing information representing said standard cell and array currents, a following gate-off pulse which occurs at the conclusion of said peak intensity portion of the flash for triggering off said integrators, a following series of pulses for stepping said readout sequencer through its several readout positions, and a final reset position, for resetting said integrators to their initial condition; and means for stepping said programming sequencer in timed relation to said readout sequencer.

* * * * *